United States Patent
Knecht et al.

(10) Patent No.: US 7,403,077 B2
(45) Date of Patent: Jul. 22, 2008

(54) REDUCED SIZE VCO/PLL MODULE

(75) Inventors: Thomas A. Knecht, Dundee, IL (US);
Glen O. Reeser, Palatine, IL (US);
Elisio C. Das Neves, Sycamore, IL (US)

(73) Assignee: CTS Corporation, Elkhart, IN (US)

( * ) Notice: Subject to any disclaimer, the term of this patent is extended or adjusted under 35 U.S.C. 154(b) by 64 days.

(21) Appl. No.: 11/432,936

(22) Filed: May 12, 2006

(65) Prior Publication Data
US 2006/0264181 A1 Nov. 23, 2006

Related U.S. Application Data

(60) Provisional application No. 60/682,436, filed on May 19, 2005.

(51) Int. Cl.
*H03B 5/32* (2006.01)
(52) U.S. Cl. .................... 331/158; 331/68; 310/348
(58) Field of Classification Search ............ 331/68, 331/108 C, 158; 310/348
See application file for complete search history.

(56) References Cited

U.S. PATENT DOCUMENTS

| 6,066,989 | A | 5/2000 | Knecht et al. |
|---|---|---|---|
| 6,661,295 | B2 | 12/2003 | Knecht et al. |
| 6,700,448 | B1 | 3/2004 | Knecht |
| 6,946,919 | B2 | 9/2005 | Knecht et al. |

FOREIGN PATENT DOCUMENTS

| JP | 2000 134095 | 12/2000 |
|---|---|---|
| JP | 2003 258633 | 12/2003 |
| JP | 2004 228823 | 12/2004 |
| JP | 2005 123514 | 12/2005 |

*Primary Examiner*—Arnold Kinkead
(74) *Attorney, Agent, or Firm*—Daniel J. Deneufbourg

(57) ABSTRACT

A reduced-size VCO/PLL module including a circuit board having a plurality of components positioned, mounted and interconnected thereon in a manner allowing the same to fit in a 10.5 mm×14 mm×2.9 mm package. In one embodiment, an inner lid encloses the VCO portion of the module. In all embodiments, an outer lid is adapted to cover all of the components on the circuit board of the module. The inner and outer lids include tabs adapted to be fitted within respective apertures defined in the board. In a preferred embodiment, the VCO portion occupies one side of the module while an integrated circuit chip and a loop filter occupy an opposite side of the module.

11 Claims, 6 Drawing Sheets

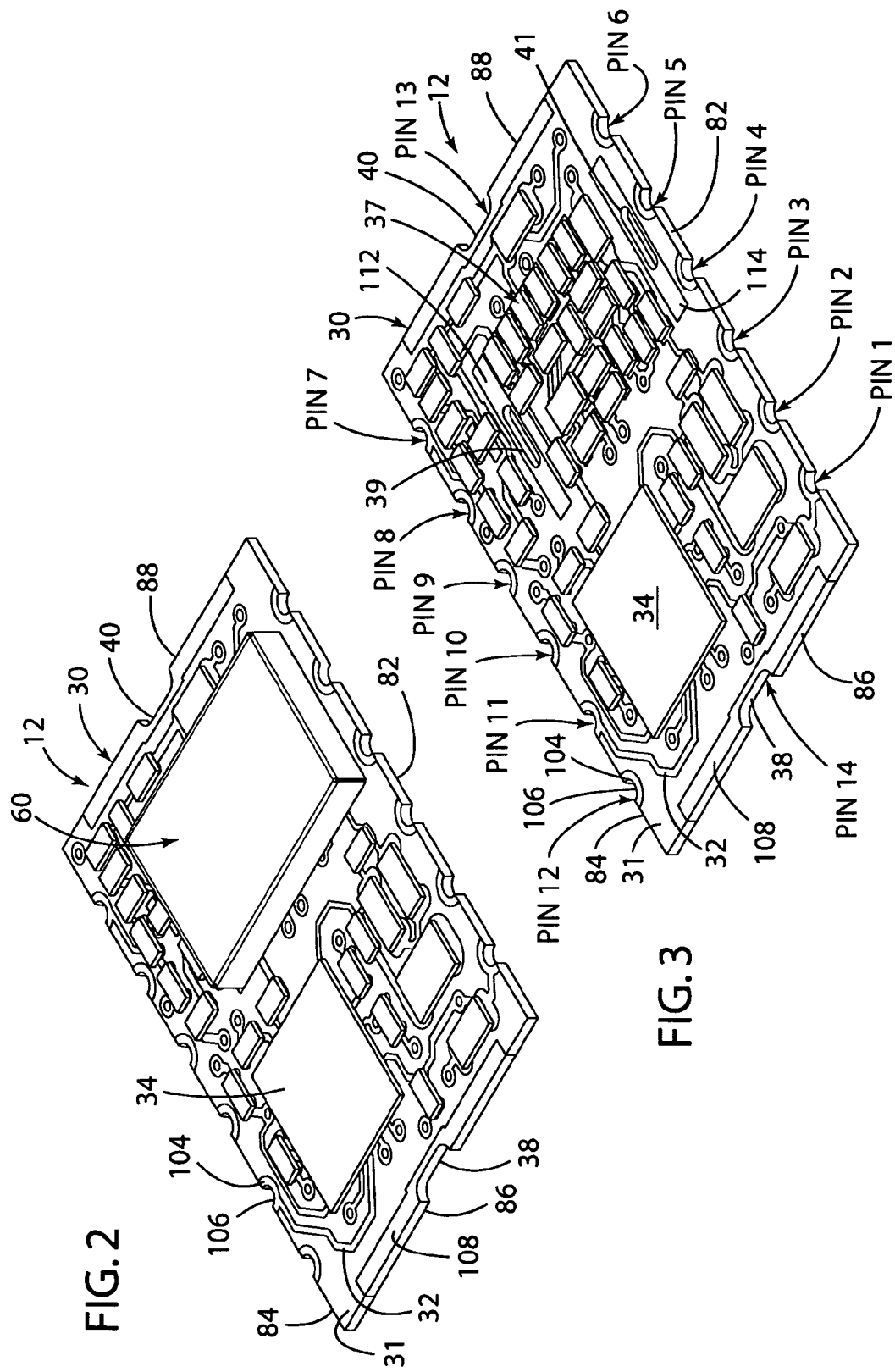

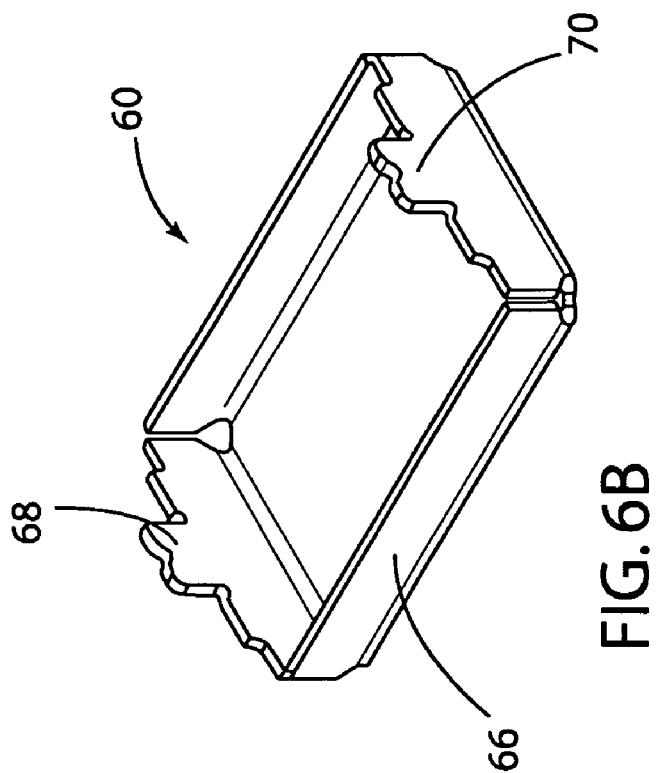
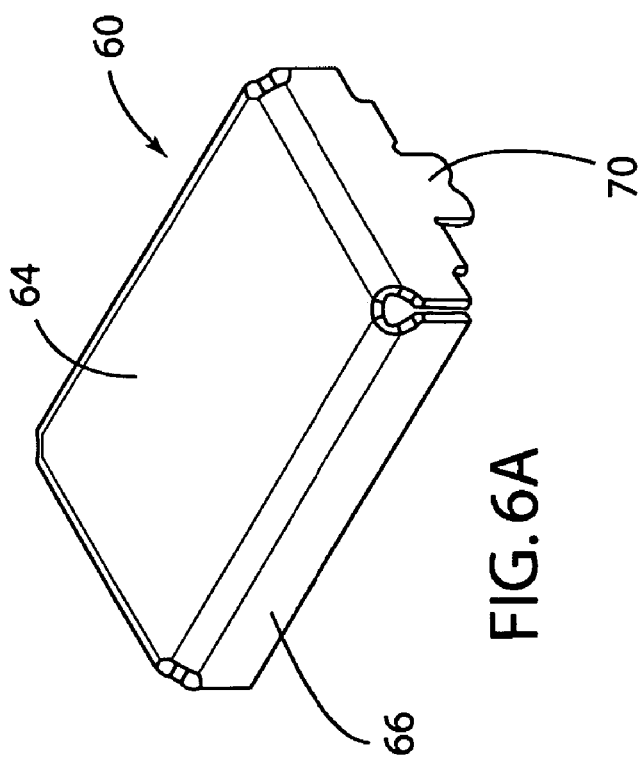
FIG. 6A
FIG. 6B

REDUCED SIZE VCO/PLL MODULE

CROSS-REFERENCE TO RELATED APPLICATION

This application claims the benefit of the filing date of U.S. Provisional Application Ser. No. 60/682,436, filed on May 19, 2005, which is explicitly incorporated herein by reference as are all references cited therein.

TECHNICAL FIELD

This invention relates to a VCO/PLL module and, more particularly, to a reduced-size VCO/PLL module adapted for use in connection with infrastructure base stations.

BACKGROUND OF THE INVENTION

A standard-size VCO/PLL module available today measures about 20.3 mm×14.7 mm×3.4 mm. The size of today's standard VCO/PLL modules, and underlying printed circuit boards, however, has proven to be too large for some of the next generation of electronic products such as, for example, the next generation infrastructure wireless base stations.

There thus remains a need for a VCO/PLL module, and underlying printed circuit board, which meets the needs and reduced size requirements of the next generation wireless infrastructure base stations. This invention meets these needs.

SUMMARY OF THE INVENTION

This invention is directed to a VCO/PLL module which is half the size of standard VCO/PLL modules and measures about 14 mm×10.5 mm×2.9 mm.

In one embodiment, the module incorporates an inner lid adapted to cover a VCO (i.e., voltage-controlled oscillator) portion of the module. Tabs on the inner lid are adapted to be fitted into respective apertures defined in the surface of the underlying printed circuit board for locating and securing the inner lid to the printed circuit board. The module additionally incorporates an outer lid adapted to cover all of the board and components thereof. Tabs on the outer lid are adapted to be fitted into respective apertures defined in respective outer side edges of the printed circuit board.

In a preferred embodiment, the VCO portion occupies a first side of the circuit board while an integrated circuit chip and a loop filter occupy an opposed side of the circuit board.

In the preferred embodiment, the board defines a first peripheral edge defining a first plurality of pads including an RF output pad and a second peripheral edge defining a second plurality of pads including an integrated circuit pad and a voltage controlled oscillator pad. In the preferred embodiment, the loop filter is located between the second peripheral edge and the integrated circuit chip, and the voltage controlled oscillator pad is located generally below the voltage controlled oscillator.

Still further, in a preferred embodiment, a buffer section is located between the first peripheral edge and the voltage controlled oscillator.

There are other advantages and features that will be more readily apparent from the following description of the invention, the drawings, and the appended exemplary claims.

BRIEF DESCRIPTION OF THE FIGURES

In the accompanying drawings that form part of the specification, and in which like numerals are employed to designate like parts throughout the same.

FIG. 2 is an enlarged top plan view of the VCO/PLL module of FIG. 1 without the top lid;

FIG. 3 is an enlarged top plan view of the VCO/PLL module of the present invention without the top and inner lids;

FIGS. 6A and 6B are enlarged perspective views of the top and interior respectively of the inner lid of the VCO/PLL module FIG. 1.

DETAILED DESCRIPTION OF THE PREFERRED EMBODIMENT

While this invention is susceptible to embodiments in many different forms, this specification and the accompanying drawings disclose only one preferred embodiment as an example of the present invention. The invention is not intended, however, to be limited to the embodiment so described.

In the FIGURES, a single block or cell may indicate several individual components and/or circuits that collectively perform a single function. Likewise, a single line may represent several individual signals or energy transmission paths for performing a particular operation.

FIGS. 1-6 depict various components of the miniature or reduced-size VCO/PLL module 12 of the present invention which is adapted for use in, for example, wireless infrastructure base stations and has dimensions of about 14 mm (length)×10.5 mm (width)×2.9 mm (height), i.e., a more than 50% reduction in size from the standard-size VCO/PLL module available today which measures about 20.3 mm (length)×14.7 mm (width)×2.9 mm (height).

Figure 4:
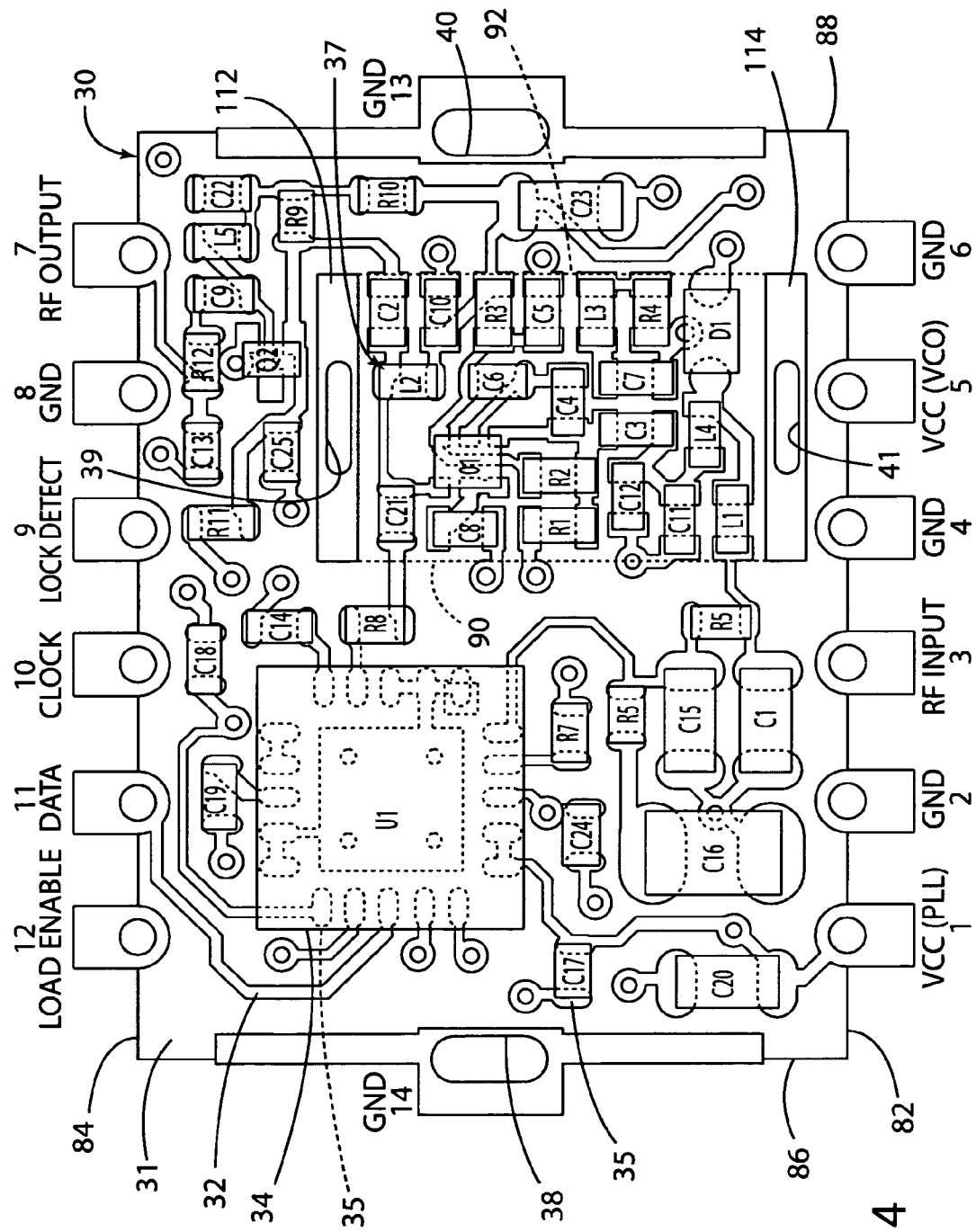
FIG. 4 is an enlarged top plan schematic view of the circuit and component layout on the front side of the printed circuit board of the VCO/PLL module of FIG. 1, the module being depicted in its form prior to final cutting.
Figure 5:
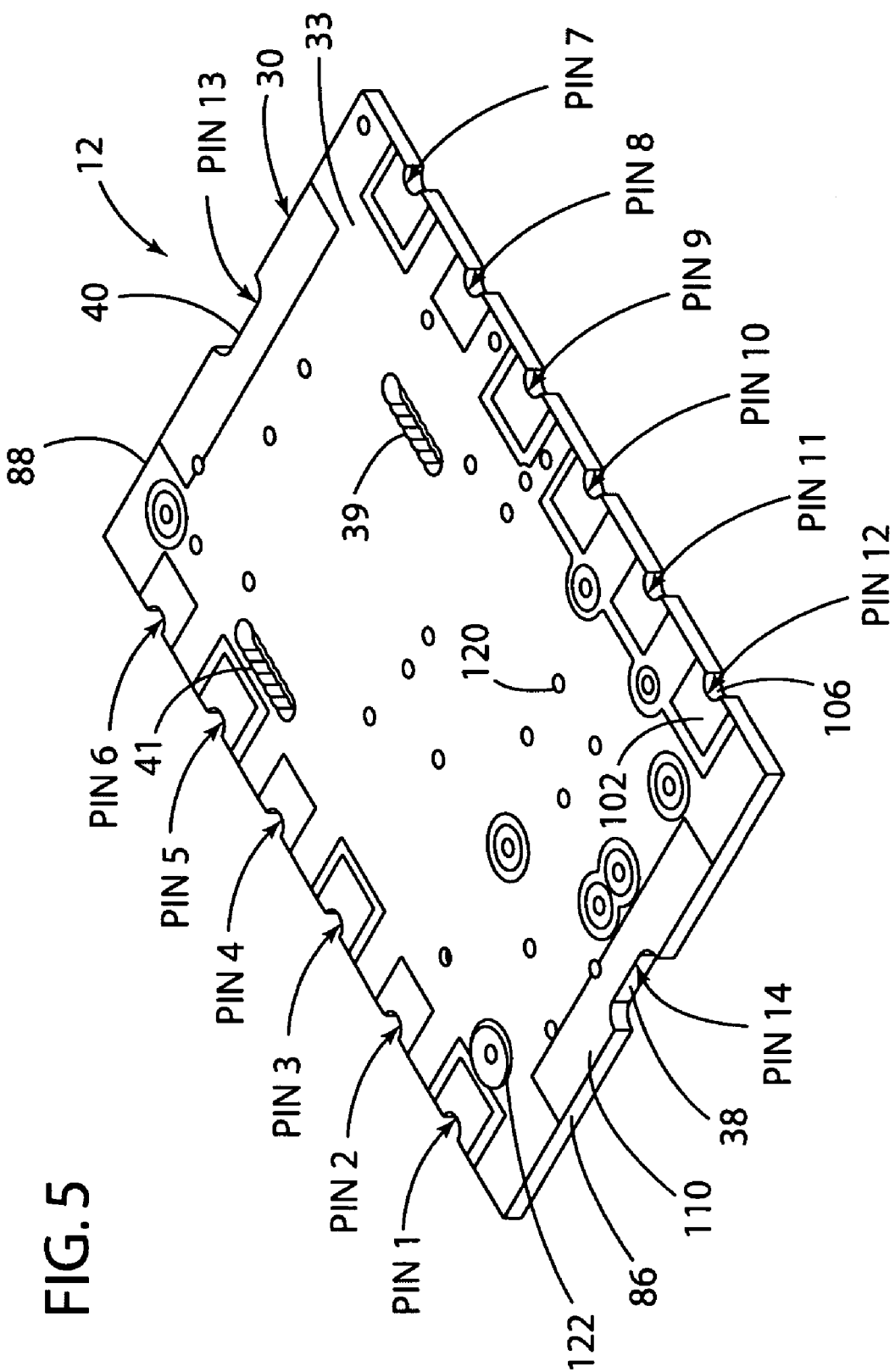
FIG. 5 is an enlarged bottom plan view of the VCO/PLL module of FIG. 1.

The pinout/pin/pad locations (i.e., pins 1-14 of the VCO/PLL module 12 of the present invention are specifically identified in FIG. 4 (pre-cut configuration) and FIG. 5 (post-cut, final configuration) and reproduced below as follows:

1) VCC (PLL)
2) GND
3) RF Input
4) GND
5) VCC (VCO)
6) GND
7) RF Output
8) GND
9) Lock Detect
10) Clock
11) Data
12) Load Enable
13) GND
14) GND The pinouts of the VCO/PLL module 12 as shown in, for example, FIGS. 3-5, are characterized in that each of the pinouts 1-6 and 7-12 are 1.0 mm wide and 1.0 mm apart from each other. Pinouts 13 and 14 are each 6.0 mm in length and 1.0 mm in width. Each of the pinouts 1-6 and 7-12 is defined by a generally square-shaped pad 102 of conductive material on the bottom surface 33 of board 30, an opposed generally semi-circular pad 104 of conductive material defined on the top surface 31 of board 30, and castellations 106 extending into the respective edges 82 and 84 between the top and bottom surfaces 31 and 32 respectively. Castellations 106 are covered with a conductive material for providing an electrical connection between the top and bottom pads of each of the pinouts.

Each of the pinouts 13 and 14 is defined by respective elongate generally rectangularly-shaped strips/pads 108 and 110 of conductive material on respective top and bottom board surfaces 31 and 33 and extending along respective edges 86 and 88. The outside surface of respective apertures 38 and 40 are also covered with a conductive material for providing an electrical connection between the pads 108 and 110.

Pinouts 1-7 are characterized in that they are located and extend along a lower peripheral edge 82 of the printed circuit board 30 in spaced-apart and parallel relationship between the left side board edge 86 and the right side board edge 88. Pinouts 7-12 are located and extend along an upper peripheral edge 84 of the printed circuit board 30 in spaced-apart and parallel relationship between the right side board edge 88 and the left side board edge 86 and in a diametrically opposed relationship to respective pinouts 1-7, Pinout 13 is located and extends along the periphery of right side board edge 88, while pinout 14 is located and extends along the periphery of left side board edge 86 in a diametrically opposed relationship relative to pinout 13.

The structure and layout of the printed circuit board 30 of the VCO/PLL module 12 of the present invention is shown in FIGS. 2-5, i.e., FIGS. 2-4 depicting the front or top surface 31 thereof and FIG. 5 depicting the back or bottom surface 33 thereof.

Front surface 31 incorporates an electrically conductive pattern (i.e., electrically conductive printed wiring or traces 32) and a plurality of mounting sites 35 (FIG. 4) for mounting the plurality of electrical components including capacitors, resistors and integrated circuits. A detailed description of the particular pattern of the wiring and traces is omitted from this description inasmuch as the same is fully disclosed and shown in FIG. 4. Although not shown, it is understood that the printed circuit board 30 is made of a plurality of conventional electrically insulative laminates (three are preferable for this design).

Still further, and although the location, arrangement and placement of each of the electrical components on the front surface 31 of board 30 is shown in complete detail in FIGS. 2-4, it is noted that board 30 generally defines first and second (left and right) halves respectively and that a chip scale package PLL IC 34 is located in the upper left corner of the first or left half of the printed circuit board 30, while a voltage controlled oscillator (VCO) 37 covers a substantial portion of the second or right half of the printed circuit board 30.

The board 30 additionally defines a pair of generally oval- or racetrack-shaped apertures 38 and 40 defined along, and extending in a generally parallel relationship to, the opposed side edges 86 and 88 of the board 30. Apertures 38 and 40 are adapted to receive the tabs (not shown) respectively of the outer metal lid or shield 50 (FIG. 1B) which is adapted to be fitted and secured over the top of the board 30.

Board 30 additionally defines a second pair of generally oval- or racetrack-shaped apertures 39 and 41 defined therein in the region above and below respectively of the VCO 37 which are adapted to receive the tabs 68 and 70 of an inner lid or shield 60 as shown in FIGS. 6A and 6B herein and described in greater detail below. As more particularly shown in FIGS. 3 and 4, aperture 39 extends generally longitudinally above the upper longitudinal edge of VCO portion or segment 37 in a direction generally normal to the side edges 86 and 88 of board 30, while aperture 41 extends generally longitudinally below the lower longitudinal edge of VCO portion or segment 37 in a diametrically opposed orientation spaced from, and generally parallel to, the aperture 39. As also shown in FIGS. 3 and 4, apertures 39 and 41 are defined in respective elongate strips 112 and 114 of conductive material extending directly above and below the VCO portion 37 in a relationship generally normal to board edges 86 and 88.

FIGS. 2-4 depict the novel and unique location and placement of each of the individual electric and electronic components on the top surface 31 of the printed circuit board 30. The selection, location, arrangement, placement, and interconnection between each of the particular individual components as shown in FIGS. 2-4 is the novelty which allows for the creation of a reduced-size 10.5 mm×14 mm×2.9 mm VCO/PLL module in accordance with the present invention. A detailed description of the location, placement and arrangement of each of the components thus follows, although the same is fully disclosed and shown in detail in FIGS. 2-4 in a manner which would allow one of ordinary skill in the art to reduce this invention to practice.

Initially, it is noted that the PLL IC chip 34 is located in the upper left-hand corner of the board 30 in a relationship spaced from and generally opposed to pinouts 10-12, In the embodiment shown, IC chip 34 is of the chip-scale type without legs to save board space. C19 is located between the upper longitudinal edge or side of the IC 34 and the upper longitudinal edge 84 of the board 30 and extends in a direction generally parallel to the board edge 84 and the upper longitudinal edge of the IC 34. In the embodiment shown, C19 is located directly beneath data pinout 11, C18 is located to the right of and spaced apart from, C19 and also extends in an orientation generally parallel to the board edge 84. C14 and R8 are located to the right of, and spaced apart from, the right side edge of the IC 34 and extend in an orientation generally parallel thereto with C14 extending downwardly from about the upper edge of the IC 34 and R8 being located below C14 and in alignment therewith.

C17, C24 and R7 are located below, and spaced apart from, the lower longitudinal edge of the IC 34. C17 is located between the side edge 86 of the board 30 and the left side edge of the IC 34. C17 extends in an orientation generally normal to the board side edge 80. C24 is spaced apart from and extends to the right of C17, while R7 extends to the right of C24. C20 is located in the lower left-hand corner of the board in a relationship generally spaced apart from and parallel to the board side edge 86. C16 is located to the right of and in a spaced and parallel relationship to, C20 and generally below C24. R6, C15 and C1 are all located to the right of C16 and generally below R7. R6, C15 and C1 extend in a spaced-apart relationship generally normal to C16. R5 is located to the right of C15 and C1 and extends in a generally normal relationship between C15 and C1. The elements C1, C15, C16, R5, and R6 in combination define the loop filter circuit or portion of the module 12 and are all located generally in the lower left-hand half region of the board 30 bounded by the left side board edge 86 on one side, the VCO section 37 on the opposite side, the IC 34 above, and the pinouts 1-3 below. The elements D1, L4, C17 and C12 comprise the tank circuit of the VCO.

The VCO portion or segment 37 generally covers the right side half of the board 30 with all of the electrical components defining the same being contained within the interior of a rectangularly-shaped outline/periphery bounded by the strips 112 and 114 at the top and bottom and the outlines 90 and 92 shown in phantom in FIG. 4 extending up and down between the opposed ends of strips 112 and 114 and measuring about 5.2 mm in width and 7.48 mm in length.

In the embodiment shown, VCO 37 is positioned on a region of the board 30 generally directly above and opposed to pinouts 4-6 and generally directly below and opposed to pinouts 7-9, VCO 37 initially comprises a first column of elements C2, C10, R3, C5, L3, R4 and D1 which are positioned adjacent the right side edge of the VCO periphery/outline 92 and extend generally downwardly from the upper strip 112 in a spaced-apart relationship in the direction of the lower strip 114 and board edge 82 and in an orientation generally normal to the right side board edge 88.

VCO 37 additionally comprises and includes L2, C6, C4, C3, C7, L4, C21, C8, Q1, R1, R3, C12, C11, and L1. L2 is located to the left of, and between, C2 and C10 and is oriented in a relationship generally perpendicular to C2 and C10. C6 is located below and in alignment with L2 and generally across from R3. C6 is positioned in an orientation generally perpendicular to R3. C4 is located below C6, positioned between C5 and L3, and extends in an orientation generally perpendicular to C6. C3 and C7 are positioned in spaced-apart relationship below C4 and extend in a relationship generally perpendicular to C4. L4 is positioned below C3 and extends in a generally normal relationship to C3. C11 and L1 are located between the left side edge of outline 90 and L4 and extend in a relationship generally perpendicular to the board side edge 88. C12 is located above C11 and between C3 and the left side edge of outline 90. C12 is oriented generally parallel to C11 and L1. R1 and R3 are located above C12 and extend in an orientation generally normal to C12. Q1 is located above R3 and extends in the same orientation as R3. C8 is located above R1 and extends in the same orientation as R1 along the left side VCO outline edge 90. C21 is located in the upper left-hand corner of the VCO periphery and above C8. C21 extends in an orientation generally parallel to the upper board edge 84 and perpendicular to C8.

The elements R1, C13, R12, C9, L5 and C22 in combination define the buffer elements or section of the module 12 and are all located in the area on the board 30 generally between the VCO 37 and the pinouts 7-9, Specifically, such elements extend in a row along the upper longitudinal edge 84 of the board 30 generally between the left side outline edge 90 of VCO 37 and the right side edge 88 of board 30. R11, C9, L5 and C22 extend in an orientation generally normal to the upper board edge 84, while C13 and R12 extend in an orientation generally parallel to the upper board edge 84.

C25 is located below and is spaced apart from C13 and extends in a relationship generally parallel to C13. Q2 is located below R12, is spaced therefrom and extends in an orientation generally normal thereto. R9 is located below, and extends between, L5 and C22 in an orientation generally normal to L5 and C22.

Module 12 additionally comprises and includes elements R10 and C23. R10 is located on the board 30 below R9 between the right side outline edge 92 of VCO 37 and the right side edge 88 of board 30 and extends in an orientation generally normal to the board edge 88. C23 is located below, and spaced apart from, R10 and extends between the right side outline edge 92 of VCO 37 and the right side board edge 88.

It is also understood that the module 12 may additionally incorporate an optional inner metal shield/lid 60 (FIGS. 2, 6A and 6B) which is adapted to be fitted over and cover the high frequency VCO portion 37 of the board 30 so as to define a self-contained VCO 37. As shown in FIGS. 6A and 6B, the lid 60 includes a roof 64 and peripheral sidewalls 66 extending generally normally downwardly therefrom. Tabs 68 and 70 depend downwardly from the lower longitudinal peripheral edge of the top and bottom sidewalls 66 respectively and are adapted to be respectively fitted into the apertures 39 and 41 defined in the board 30. In accordance with the invention, the inner shield or lid 60 is adapted to reduce spurs and advantageously increase the reverse isolation of the module 12. In applications where increased performance is not required, the interior shield 60 can be omitted altogether. Although not shown in any of the figures, it is understood that the outer lid 50 (FIG. 1) has the same general structure as the inner lid 60 except that the outer lid 50 is sized to cover and enclose the entire board 30.

It is still further understood that, as shown in FIG. 5, board 30 defines a plurality of grounded and ungrounded vias 120 and 122 respectively extending through the interior of board 30 between the respective top and bottom surfaces 31 and 33.

Figure 7:
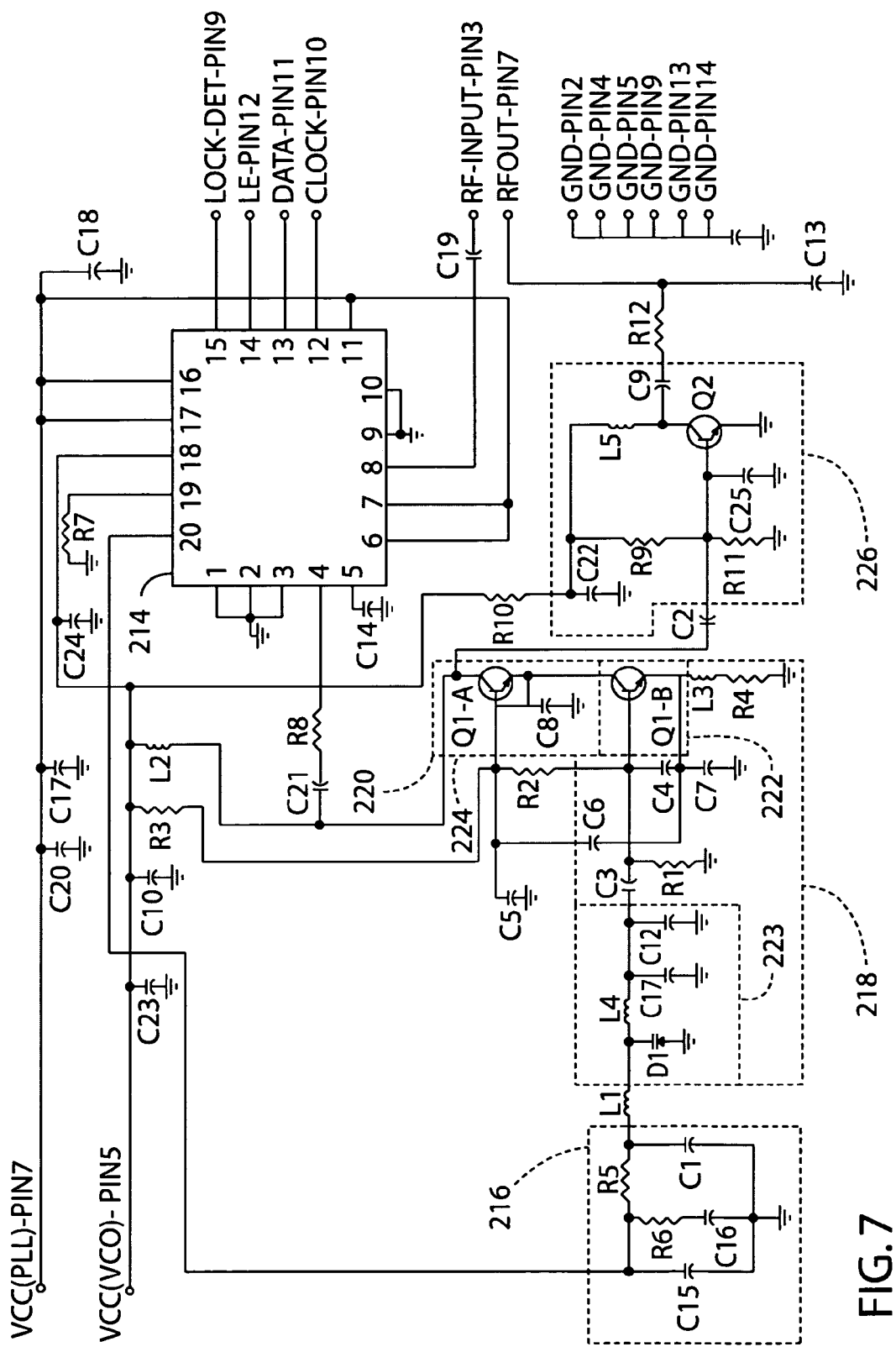
FIG. 7 is a schematic diagram of the electrical circuit of the VCO/PLL module of FIG. 1.

FIG. 7 is a detailed schematic diagram of the electrical circuit of the VCO/PLL module 12 of the present invention. Particularly, and as shown therein, the circuit of VCO/PLL module 12 comprises a plurality of standard electrical components including capacitors, resistors, inductors, varactors and integrated circuits which have been arranged and interconnected in the manner shown in detail in FIG. 7.

Although not described herein in detail, it is noted that the circuit defines, among other circuits and sections, a PLL IC circuit 214 located in the upper right-hand corner of the module circuit, a loop filter circuit 216 located in the lower left-hand corner of the circuit, a Colpitts oscillator circuit 218 immediately to the right and interconnected to the loop filter circuit 216, a cascoded transistor circuit 220 including an oscillator stage 222 and a buffer stage 224, and an additional output buffer stage 226 immediately to the right of the Colpitts oscillator circuit 218 and below the PLL IC circuit 214. Each of the individual circuits described above, of course, is defined by the plurality of electrical components arranged and interconnected as shown in detail in FIGS. 2-5 and described in detail above.

C20, C18, and C17 are all bypass capacitors on the PLL supply line, or circuit VCC (PLL) Pin 1, Each of the capacitors is located between the PLL supply line and ground. C23, C10 and C22 are all bypass capacitors on the VCO supply line, Pin 5, Each of the capacitors is positioned between the VCO supply line and ground. Pins 10, 11 and 12 define the digital input lines for the customer to program the PLL IC 14 to the desired output frequency. Pin 9 is the lock detect pin that indicates whether the PLL IC 14 is in lock or not. Pin 3 is the reference input frequency line to the PLL. It is capacitively coupled with C19 to the PLL IC 14. C24 and C14 are bypass capacitors connected to the PLL IC 14. R7 is a resistor to ground which is connected to the PLL IC 14.

The loop filter circuit 216 is comprised of C15, R6, C16, R5 and C1. A resonator tank circuit 23 is part of oscillator circuit 218 and comprises D1, L4, C17 and C12. C3 is the coupling capacitor between the tank circuit 223 and the oscillator gain stage of oscillator circuit 218. C4 and C7 are the feedback capacitors in the oscillator loop or circuit 218. L3 and R4 are also part of oscillator circuit 18 and connect the emitter of Q1-B to ground. Q1-B is the transistor defining the oscillator gain block of the circuit.

C5 couples the base of transistor Q1-A to ground. L1 is an inductor in series between the loop filter circuit 216 and the tank circuit 223 which suppresses unwanted AC signals on the DC line. Q1-A is the transistor that defines the first buffer stage block of the circuit.

C2 is a coupling capacitor located between the first buffer stage 224 and the second buffer stage 226. Buffer stage 226 comprises C22, R9, L5, R11, C25, Q2 and C9. The main portion of buffer stage 224 comprises Q1-A, C8 and Q1-B along with biasing resistors R1, R2 and R3. C2, along with C25, also act as a voltage divider between the first buffer stage 224 and the second buffer stage 226. C8 is part of oscillator stage 222 and comprises a bypass capacitor located between the collector of Q1-B and the emitter of transistor Q1-A. C6 RF couples the emitter of Q1-B and the base of Q1-A.

L2 is an inductor that allows the DC voltage from Pin 5 to supply power to the transistors Q1-A and Q1-B and not allow AC signal to pass. L5 performs the same function for the second buffer stage transistor.

The output of the first buffer stage 224 is also coupled back to the PLL IC circuit 214 through C21 and R8.

R1, R2 and R3 define the bias resistors that bias the buffer transistor Q1-A and the oscillator transistor Q1-B. Transistors Q1-A and Q2-B are both housed in the same package to save space. R9 and R11 are the bias resistors for the second buffer stage, Q2. R10 is a resistor which drops the voltage to the second buffer stage, Q2.

C9, R12, and C13 are the output termination elements that form an output matching network. The RF output pin is 7, Pins 2, 4, 6, 8, 13 and 14 are all ground pins.

One of the novel features of the present invention is the predominant use of 0.020"×0.040" chip components without any resultant compromise in the performance of the module. By way of example, a 1630-1706 MHz VCO/PLL module using this design will have a typical phase noise of −148 dBc/Hz at 1.2 MHz offset.

The VCO/PLL module 12 of the present invention is adapted to be processed in a 2.6"×4.5" "24 UP" array as known in the art which allows for the manufacture and processing of a total of twenty-four VCO/PLL modules in accordance with the present invention. Although not depicted in any of the drawings, it is understood that the array comprises a board with twenty-four circuit boards formed thereon, each being adapted to define a board 30 of the module 12 of the present invention.

The process of fabricating a plurality of modules 12 in accordance with the present invention is briefly described below. Initially, silver/tin solder or the like conductive material is screen printed and applied to the top surface of each of the twenty-four array boards in a manner so as to define the printed wiring pattern or traces 32 and pinouts 1-14 of the board 30 shown in FIGS. 2-5. As part of the screen printing process, solder is also simultaneously screen printed onto both the top surfaces 31 and 33 respectively of the plurality of array boards in the region surrounding both the peripheral outer apertures 38 and 40 and the interior apertures 39 and 41 thereon. Still further, and as part of the screen printing application, the strips of solder are additionally simultaneously screen printed along the opposed side edges 86 and 88 of the board 30 to define the strips 108 and 110. Still further, a pair of solder strips are simultaneously screen printed onto and extend generally longitudinally above and below the VCO portion 37 of the board 30 to define the strips 112 and 114.

Once the solder has been appropriately applied to all of the desired areas of each of the boards, all of the electrical components are picked from a tape and reel (as known in the art) and subsequently placed onto each of the array boards and, more particularly, positioned over each of the component sites as depicted in FIG. 4.

Inner lids 60 of the type shown in FIGS. 6A and 6B can then be picked from a tape and reel and subsequently positioned over the VCO portion 37 of each of the array boards in a manner wherein the peripheral edges of the sidewalls 66 of lid 60 are seated on the board and overlie the respective VCO outline side edges 90 and 92 and solder strips 112 and 114, and the tabs 68 and 70 are fitted into the respective board apertures 39 and 41.

Figure 1:
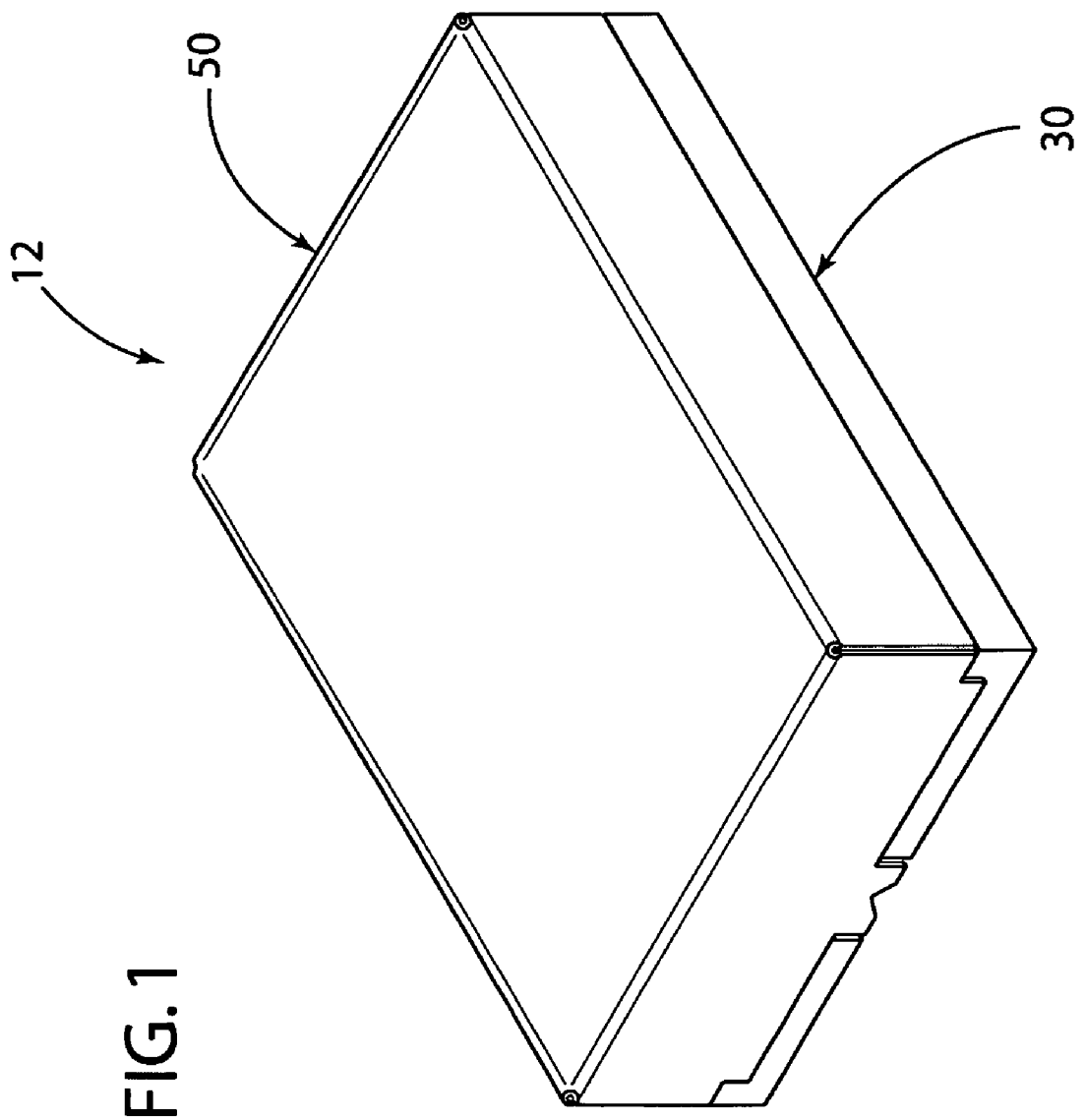
FIG. 1 is an enlarged perspective view of a VCO/PLL module in accordance with the present invention.

Outer lids 50 of the type shown in FIG. 1 are then picked from a tape and reel and subsequently positioned and secured over each of the array boards in a manner wherein the lower peripheral edges of the walls thereof follow and are seated over the peripheral edges 82, 84, 86 and 88 of the board 30, the lower edges of the two sidewalls thereof being seated over the solder strips 110, and the tabs thereof are fitted into the respective board apertures 38 and 40.

The solder is then reflowed, as is known in the art, so as to secure each of the components to each of the array boards. In accordance with the present invention, the solder surrounding the board apertures 38-41, when reflowed, flows into the respective apertures 38-41 and into sealing contact with the respective lid tabs fitted therein so as to seal and secure both the outer and inner lids 50 and 60 to the board 30.

A dicing saw is then used as known in the art to cut and separate each of the twenty-four completed modules 12 which have been formed on the array 70. Following dicing, the apertures 38 and 40 defined on each of the modules 12 shown in FIG. 4 are cut in half so as to form the module 12 of FIGS. 1-3 and each of the modules 12 is finally tested.

Numerous variations and modifications of the embodiment described above may be effected without departing from the spirit and scope of the novel features of the invention. No limitations with respect to the specific module illustrated herein are intended or should be inferred.

We claim:

1. A VCO/PLL module comprising a circuit board including a plurality of components which have been selected, positioned, mounted, and interconnected on said circuit board in a manner so as to define a VCO/PLL module having outer dimensions of approximately 14 mm in length and 10.5 mm in width, the circuit board and selected ones of the components mounted on said circuit board defining a high frequency VCO portion enclosed by an inner lid and the circuit board is enclosed by an outer lid, said circuit board further defining a pair of apertures surrounding said VCO portion thereof and said inner lid includes a pair of tabs adapted to be fitted within said respective apertures.

2. A VCO/PLL module comprising a circuit board including a plurality of components which have been selected, positioned, mounted, and interconnected on said circuit board in a manner so as to define a VCO/PLL module having outer dimensions of approximately 14 mm in length and 10.5 mm in width, and having a height of approximately 2.9 mm.

3. A VCO/PLL module comprising a circuit board including a plurality of components which have been selected, positioned, mounted, and interconnected on said circuit board in a manner so as to define a VCO/PLL module having outer dimensions of approximately 14 mm in length and 10.5 mm in width, the circuit board generally defining first and second halves, a VCO being defined and located on the first half of the board and a loop filter and a PLL IC being defined and located on the second half of the board, the circuit board further defining opposed first and second peripheral edges, the first peripheral edge defining a first plurality of pads extending along the length thereof including an RF output pad, the second opposed peripheral edge defining a second plurality of pads extending along the length thereof including an RF output pad, the second opposed peripheral edge defining a second plurality of pads extending along the length thereof including a PLL IC input pad and a VCO input pad, the PLL IC pad being located generally below the loop filter and the VCO input pad being located generally below the VCO.

4. The VCO/PLL module of claim 3 wherein a plurality of the components on the circuit board define a buffer section located on the board between the VCO and the RF output pad.

5. A VCO/PLL module comprising a circuit board including a plurality of components which have been selected, positioned, mounted, and interconnected on said circuit board in a manner so as to define a VCO/PLL module having outer dimensions of approximately 14 mm in length and 10.5 mm in width and a plurality of the components on the circuit board define first and second buffer stages.

6. A VCO/PLL module comprising a circuit board including a plurality of components which have been selected, positioned, mounted, and interconnected on said circuit board in a manner so as to define a VCO/PLL module having outer dimensions of approximately 14 mm in length and 10.5 mm in width and a plurality of the components on the circuit board define an oscillator gain stage including a transistor and a buffer stage, said transistor and said buffer stage being housed in the same package.

7. A VCO/PLL module measuring approximately 14 mm in length and 10.5 mm in width and comprising a single printed circuit board having a plurality of components mounted thereon, the printed circuit board generally defining first and second halves and including a plurality of components located on the first half in combination defining a voltage controlled oscillator, the second half including both an integrated circuit chip and a plurality of components in combination defining a loop filter, the circuit board defining opposed upper and lower peripheral edges, said integrated circuit being positioned adjacent the upper peripheral edge and the components defining the loop filter being positioned between the integrated circuit chip and the lower peripheral edge of said board.

8. A VCO/PLL module measuring approximately 14 mm in length and 10.5 mm in width and comprising a single printed circuit board having a plurality of components mounted thereon, the printed circuit board generally defining first and second halves and including a plurality of components located on the first half in combination defining a voltage controlled oscillator, the second half including both an integrated circuit chip and a plurality of components in combination defining a loop filter, said components defining said voltage controlled oscillator occupying an area on said circuit board measuring approximately 5.2 mm in width and 7.48 mm in length.

9. The VCO/PLL module of claim 8 further comprising a lid adapted to cover said plurality of components defining said voltage controlled oscillator.

10. The VCO/PLL module of claim 9 wherein said lid defines a pair of mounting tabs adapted to be fitted within a pair of apertures defined in said circuit board.

11. The VCO/PLL module of claim 7 further comprising a plurality of components on said circuit board which in combination define a buffer stage, said components defining said buffer stage being located in a region of said first half of said circuit board between said upper peripheral edge of said circuit board and said voltage controlled oscillator.

* * * * *